(12) United States Patent
Sofer et al.

(10) Patent No.: US 7,932,731 B2
(45) Date of Patent: Apr. 26, 2011

(54) DEVICE AND METHOD FOR TESTING A NOISE IMMUNITY CHARACTERISTIC OF ANALOG CIRCUITS

(75) Inventors: Sergey Sofer, Reshon Letzion (IL); Yehim-Haim Fefer, Petah Tikva (IL); Valery Neiman, Rishon Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 223 days.

(21) Appl. No.: 12/278,485

(22) PCT Filed: Feb. 9, 2006

(86) PCT No.: PCT/IB2006/050431
§ 371 (c)(1),
(2), (4) Date: Aug. 6, 2008

(87) PCT Pub. No.: WO2007/091129
PCT Pub. Date: Aug. 16, 2007

(65) Prior Publication Data
US 2009/0134883 A1 May 28, 2009

(51) Int. Cl.
*G01R 29/26* (2006.01)
(52) U.S. Cl. ............ 324/613; 324/76.11; 324/765
(58) Field of Classification Search ............ 324/765, 324/613, 76.11
See application file for complete search history.

(56) References Cited

U.S. PATENT DOCUMENTS

| 6,286,117 | B1 | 9/2001 | Yun et al. | |
|---|---|---|---|---|
| 7,359,811 | B1* | 4/2008 | Liu | 702/69 |
| 2004/0104732 | A1 | 6/2004 | Oosawa et al. | |
| 2004/0128115 | A1 | 7/2004 | Chen et al. | |
| 2005/0122138 | A1 | 6/2005 | Chansungsan et al. | |
| 2005/0270199 | A1* | 12/2005 | Gupta | 341/120 |

FOREIGN PATENT DOCUMENTS
EP 1607835 A 12/2005
JP 2004309153 A 11/2004

OTHER PUBLICATIONS

Fefer et al; "Automatic system for VLSI on-chip block synthesizers characterization" Electronics, Circuits and Systems, 2004. ICECS 2004. Proceedings of the 2004 11th IEEE International Conference on Dec. 13-15, 2004 pp. 587-590.

* cited by examiner

*Primary Examiner* — Vincent Q Nguyen

(57) ABSTRACT

A device for testing noise immunity of a circuit includes: an analog circuit, an internal stable reference signal source, an internal power supply module to receive a high level voltage supply, and a signal modulator to provide a noisy signal to the power supply module. The power supply module outputs a noisy power supply to the circuit, in response to the noisy signal, and the device outputs a signal representative of a noise immunity of the circuit. A method includes: providing a high level supply voltage to an internal power supply module, receiving signals representative of the performance of an analog circuit, providing a noisy signal to an input of the power supply module, providing a noisy supply voltage to the circuit, by the power supply module, in response to the noisy signal, and evaluating a noise immunity characteristic of the circuit in response to the received signals.

20 Claims, 4 Drawing Sheets

DEVICE AND METHOD FOR TESTING A NOISE IMMUNITY CHARACTERISTIC OF ANALOG CIRCUITS

FIELD OF THE INVENTION

The present invention relates to devices and methods for testing one or more noise immunity characteristics of analog circuits.

BACKGROUND OF THE INVENTION

During the last decade pure analog circuit as well as mixed signal circuits were integrated with digital circuits.

Various modern system on chip (SoC) integrated circuits as well as other types of integrated circuits include analog circuits. Analog circuits are much more sensitive to noise than digital circuits. In many cases the digital circuit generates a noise signal that can disrupt the operation of analog circuits. At least some of the noise signals propagate along the power supply conductors.

U.S. Pat. No. 6,286,117 of Yun et al., being incorporated herein by reference, describes a circuit and method that provide a noisy output signal to a logic device.

U.S. patent application publication serial number 2004/0104732 of Oosawa et al., being incorporated herein by reference, describes a method and device for switching between signals provided by a digital test circuit (that tests a digital test circuit) and between signals provided by an analog circuit.

In order to reduce the noise that is received by the analog circuit many modern integrated circuits feed the analog circuit with a supply voltage provided by an internal power supply module. The internal power supply module usually receives a stable reference signal and a non-stable high level voltage supply and outputs a more stabilized supply voltage to the analog circuit.

Nevertheless, even when an internal power supply module is used, a certain amount of noise may be induced by surrounding digital circuits and still reaches the analog circuit.

Merely providing a noisy high-level voltage supply to the internal power supply module (via an input of the integrated circuit) does not test the noise immunity characteristics of the analog circuit but rather provides an indication about supply noise rejection ratio of the internal power supply.

There is a need to provide an efficient method and device for testing one or more noise immunity characteristics of an analog circuit within an integrated circuit.

SUMMARY OF THE PRESENT INVENTION

A device and a method for testing one or more noise immunity characteristic of an analog circuit of an integrated circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

An analog circuit is a circuit that includes analog components. It can be a pure analog circuit or a mixed signal circuit that include both analog and digital components.

A noise immunity characteristic can reflect a relationship between one or more noise signals and one or more signal generated by an analog circuit. A noise immunity characteristic can reflect a relationship between a noise signal and a signal that is outputted by the analog or a mixed circuit. For example, if the analog circuit generates a clock signal then the characteristic can represent any kind of jitter, introduced by a noise signal. It is noted that the at least one noise immunity characteristic can relate to one or more components of a noise signal.

A device is provided. The device includes: (i) an analog or mixed circuit, (ii) an internal stable reference signal source, (iii) an internal power supply module that is connected to the analog circuit and is adapted to receive, via a first input, a high level voltage supply, (iv) a signal modulator that is adapted to provide, during a test period, a noisy signal to a second input of an internal power supply module. The internal power supply module is adapted to output a noisy supply voltage to the analog circuit, in response to the noisy signal. The device is adapted to output an output signal representative of a noise immunity characteristic of the analog circuit.

A method is provided. The method includes: (i) providing a high level supply voltage to a first input of an internal power supply module of an integrated circuit, (ii) providing, during a test period, a noisy signal to a second input of the internal power supply module, (iii) providing a noisy supply voltage to the analog circuit, by the internal power supply module, in response to the noisy signal; (iv) receiving signals from the integrated circuit representative of the performance of the analog circuit, and (v) evaluating one or more noise immunity characteristic of the analog circuit in response to the received signals.

According to an embodiment of the invention the analog circuit has to operate according to a predefined specification. If one or more noise signals cause the analog circuit to deviate from the predefined specification than the analog circuit can be declared as non-operational or not immune to noise.

For example, if one or more noise signals cause a phase locked loop (PLL) to generate a clock signal that has a jitter that exceeds a certain threshold than the PLL (and an integrated circuit or a larger device that include the PLL) can be declared as non-operational.

Figure 1:
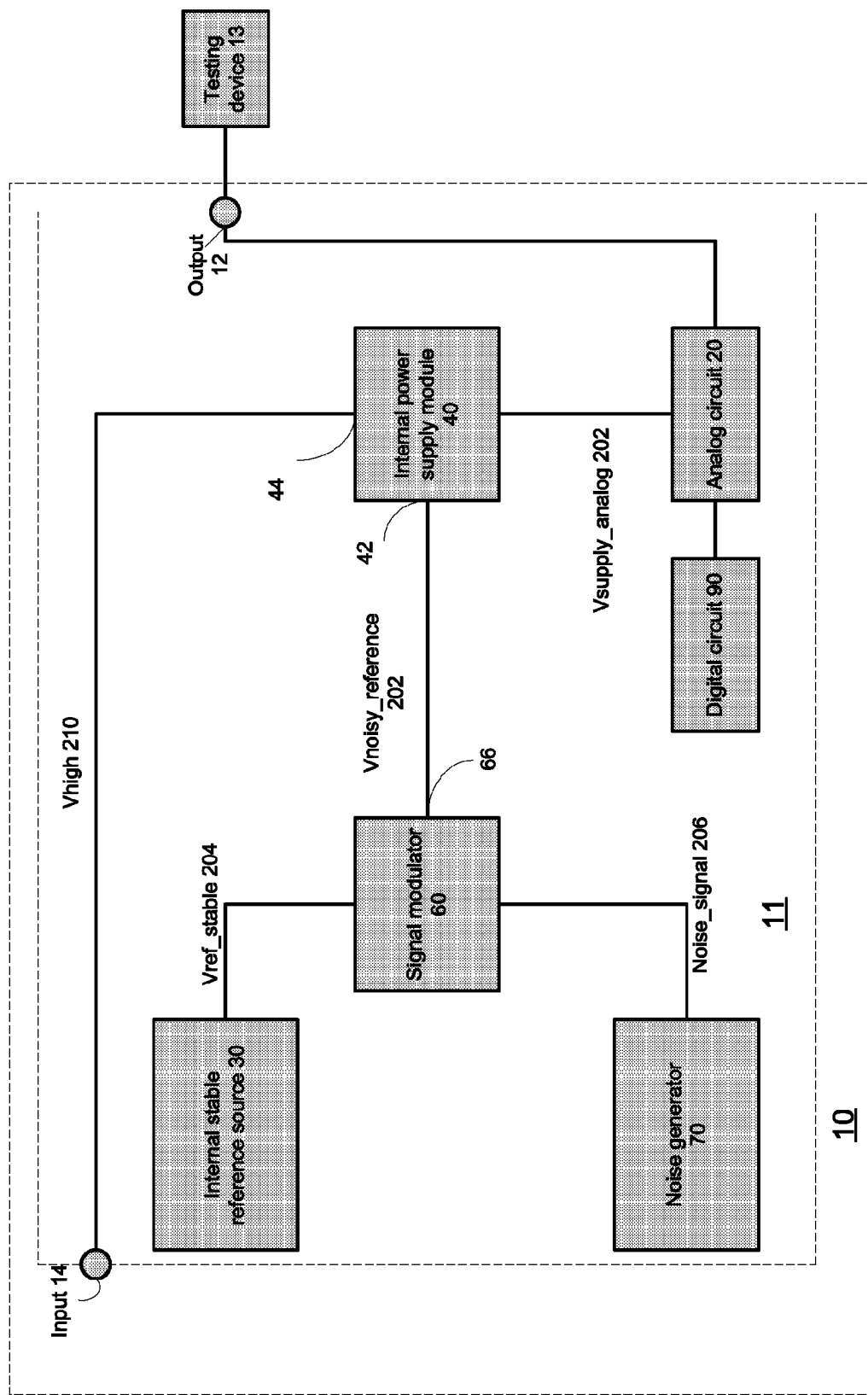
FIG. 1 illustrates an integrated circuit and a testing device, according to an embodiment of the invention.

FIG. 1 illustrates device 10 according to an embodiment of the invention.

Device 10 can include one or more integrated circuits, multiple integrated circuits, that may be a part of a mobile phone, personal data accessory, media player, computer, controller and the like. Those of skill in the art will appreciate that device 10 can include many components and units that are not illustrated in FIG. 1. Device 10 can include fewer components than those that are illustrated in either one of the following drawings or include other components.

For simplicity of explanation it is assumed that device 10 includes one integrated circuit 11. Integrated circuit 11 has an input 14 and an output 12. The output 12 is used to provide output signals that can be processed to determine one or more noise immunity characteristics of analog circuit 20. It is noted that these output signals can be provided from analog circuit 20 or from another circuit (such as digital circuit 90) that is affected by signals outputted from analog circuit 20. It is noted that integrated circuit 11 usually includes a large number of input and outputs.

According to an embodiment of the invention the evaluation of the one or more noise immunity characteristics of analog circuit 20 can be performed by an external testing device, such as testing device 13. Testing device 13 is not included within integrated circuit 11.

Figure 2:
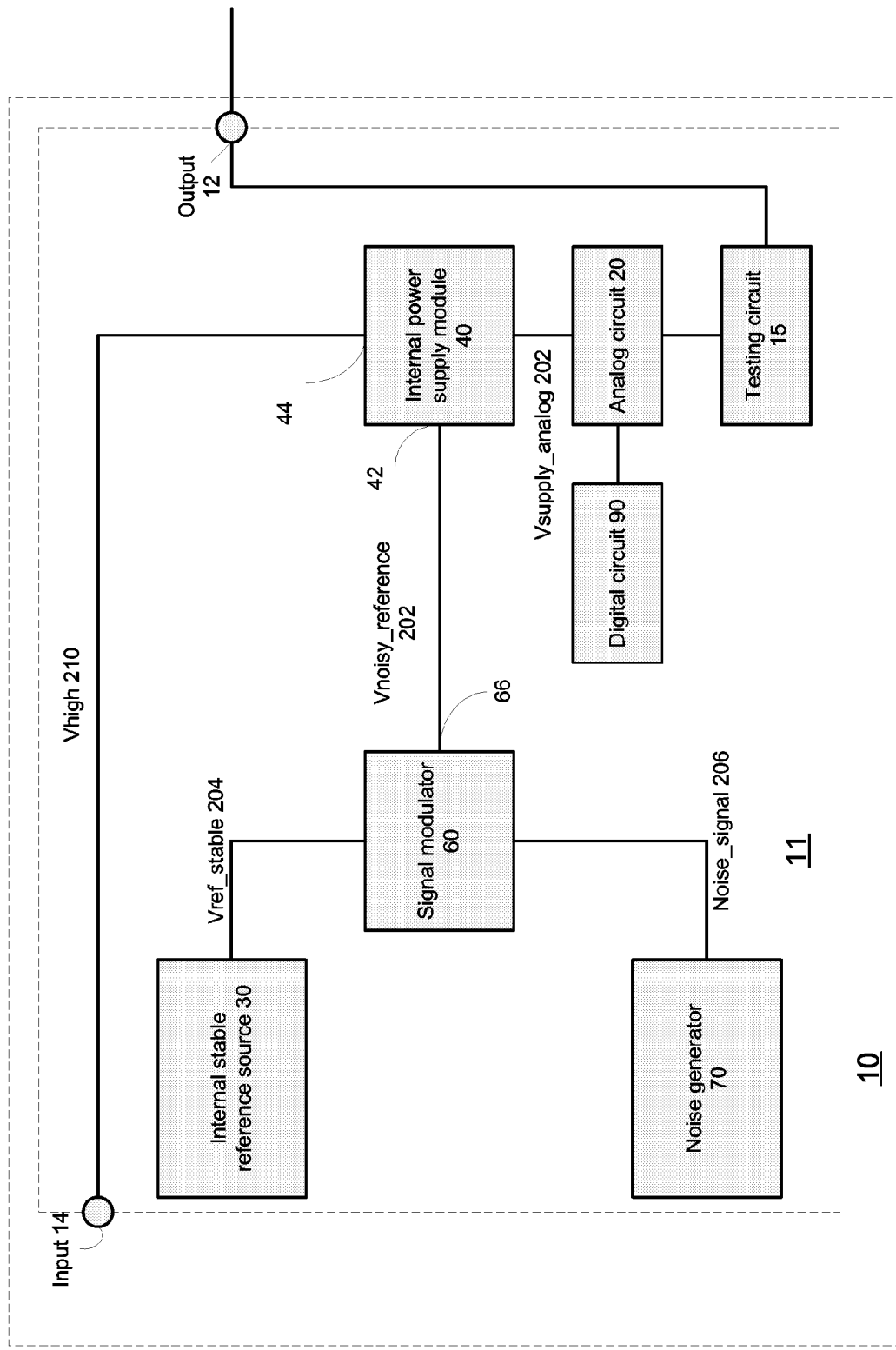
FIG. 2 illustrates a device and a testing device, according to another embodiment of the invention.

According to yet another embodiment of the invention the evaluation of the one or more noise immunity characteristic of analog circuit 20 can be performed by an internal testing circuit (such as internal testing circuit 15 of FIG. 2) that is included within integrated circuit 11. This embodiment is illustrated in FIG. 2.

According to yet another embodiment of the invention one or more noise immunity characteristics can be evaluated by an internal testing circuit and an external testing device. It is noted that the internal testing circuit can be a part of a built in self test (BIST) module, but this is not necessarily so.

If, for example, the analog circuit 20 generates a clock signal then the testing circuit (or testing device) can include a counter that is adapted to count the number of clock signals (provided by the analog circuit) within a predefined period. Additionally or alternatively, the testing circuit can compare a quiet reference clock signal to the clock signal provided by analog circuit 20. The comparison can include phase difference evaluation, jitter evaluation and the like.

The testing device can be a conventional testing tool such as an oscilloscope, a spectrum analyzer, a computer based tester and the like.

Those of skill in the art will appreciate that the evaluation of one or more noise immunity characteristics of analog circuit 20 can be performed in an automatic manner (completely by a testing circuit), but this is not necessarily so. An operator can evaluate the one or more noise immunity characteristic of analog circuit 20 based upon test results that are measured and/or displayed by the testing circuit.

Integrated circuit 11 includes an analog circuit 20, an internal stable reference signal source 30, an internal power supply module 40 and a signal modulator 60. Conveniently, the integrated circuit 11 also includes a digital circuit 90.

The internal power supply module 40 provides a supply voltage (Vsupply_analog) 202 to the analog circuit 20. The internal power supply module 40 includes a first input 42, a second input 44 and an output 46. The first input 42 is connected to an output 66 of signal modulator 60. The signal modulator 60 receives a stable reference voltage (Vref_stable 204) from the internal stable reference signal source 30.

The signal modulator 60 also receives, during a test period, a noise signal (noise_signal 206) from internal noise generator 70. In response to noise_signal 206 and Vref_stable 204 the signal generator 60 provides, during a test period, a noisy signal (Vnoisy_reference 208) to a second input 44 of the internal supply module 40. In response to these input signals the internal power supply module 40 outputs, via output 46, to the analog circuit 20 a noisy Vsupply_analog 202. Conveniently, Vsupply_analog 202 is the only supply voltage of the analog circuit 20.

According to an embodiment of the invention the noise generator 70 (and optionally additional components of integrated circuit 11) is controlled by one or more control signals (or even instructions). These control signals can be provided by an external device (even by external testing device 13), or by an internal device (such as internal testing circuit 15, a controller or processor within integrated circuit 11). Various prior art circuits and method for controlling the noise generator can be applied.

The internal supply module 40 receives, during the test period, at a first input 42, a high level voltage supply (Vhigh 210) from input 14 of integrated circuit 11.

During other periods, such as during a normal operation period, the internal noise generator 70 does not output a noise signal. It can provide a constant value signal.

The analog circuit 20 is connected to output 12 of integrated circuit such as to provide an output signal representative of a noise immunity characteristic of the analog circuit 20. It is noted that output 12 can be connected to other components of integrated circuit, such as to the digital circuit 90. These components can be responsive to one or more analog signals provided by analog circuit 20 such that a monitoring of signals outputted by output 12 provide an indication about the noise immunity characteristic of the analog circuit 20.

If, for example, the analog circuit 20 includes a PLL that generates a clock signal that is used to clock one or more components of the integrated circuit 11 than output 12 can provide the clock signal, or a signal that is synchronized to the clock signal or a signal that is gated in response to the clock signal.

The signal modulator 60 can generate noisy_reference 208 in various manners. According to an embodiment of the invention it can add noise_signal 206 to Vref_stable 204 to provide Vnoisy_reference 208. According to yet another embodiment of the invention the signal modulator 60 amplifies Vref_stable 204 by a stable reference voltage gain factor and adds the amplified signal to the product of noise_signal 206 and a noise signal gain factor.

According to an embodiment of the invention the signal modulator 60 includes operational amplifier 62. An exemplary signal modulator 60 that includes an operational amplifier is further illustrated in FIG. 3.

Noise_signal 206 can be a narrowband clock signal, a wideband step signal and the like. According to an embodiment of the invention noise_signal 206 emulates a noise that is generated by digital circuit 90. It can emulate various repetitive noises that can be generated, for example, during an execution of multiple iteration of a software loop. The noise generator 70 can include an oscillator or other signal generators known in the art.

According to an embodiment of the invention the noise generator 70 is adapted to alter a frequency of the noise signal during the test period. Thus, during a single test period the response of the analog circuit 20 to various noise frequencies can be measured.

According to yet another embodiment of the invention the spectrum of noise_signal 206 can change between different test periods. Thus, at a certain test period the spectrum of noise_signal 206 can be a certain spectrum while during another test period the spectrum of noise_signal 206 can be a different spectrum. It is noted that the noise signal spectrum can change both during a test period and between test periods.

Conveniently, one or more characteristics of noise_signal 206 can be determined in response to one or more characteristics of the analog circuit 20 and/or the digital circuit 90. For example, if analog circuit 20 can be more susceptible to a noise signal that has certain a spectrum then noise_signal 206 be designed such as to have these frequencies or such a certain spectrum. Noise_signal 206 can also be responsive to an expected noise generated by digital circuit 90 or by other components of integrated circuit 11. The susceptibility of analog circuit 20 can be learnt from the structure of the analog circuit 20, from simulations, from previous measurements of noise immunity of various analog circuits, and the like.

It is noted that the characteristics of the noise signal can also be influenced by the expected (or measured) noise signals.

Figure 3:
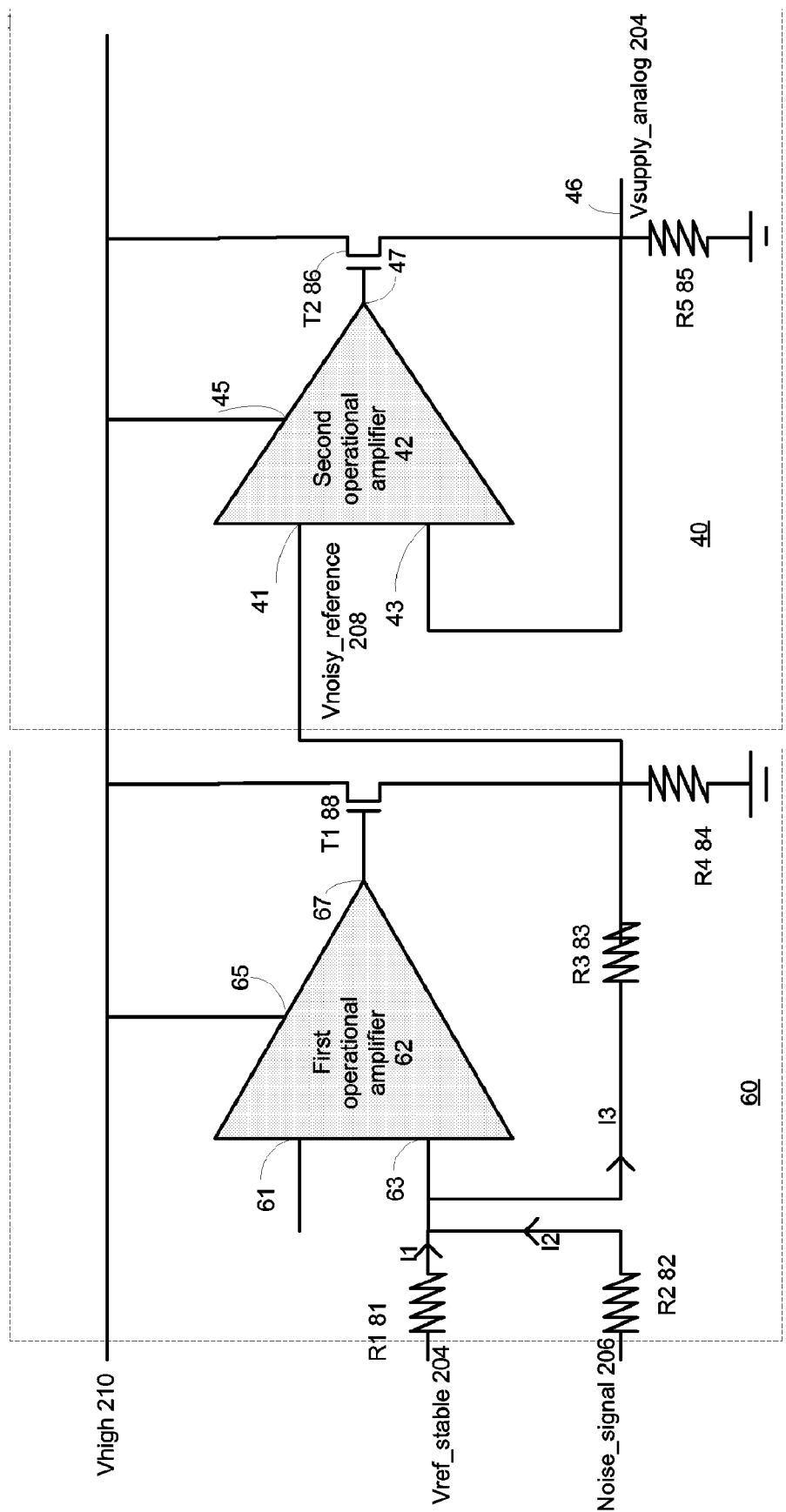
FIG. 3 illustrates a signal modulator and an internal power supply module, according to an embodiment of the invention.

FIG. 3 illustrates a signal modulator 60 and an internal power supply module 40, according to an embodiment of the invention.

Signal modulator 60 includes a first operational amplifier 62. A negative input 61 of the first operational amplifier 62 receives an offset voltage that sets its working point. The positive input 63 of the first operational amplifier 62 is connected to one end of a first resistor R1 81, to a first end of a second resistor R2 82 and to a first end of a third resistor R3 83. The second end of R1 81 receives Vref_stable 204, the second end of R2 82 receives noise_signal 206, thus a first current I1 (I1=Vref_stable/R1) and a second current I2 (I2=noise_signal/R2) are combined to provide a third current I3 that flows through R3 83. The second end of R3 83 is connected to a first end of a fourth resistor R4 84 and to a source of first transistor T1 88. The second end of R4 84 is grounded. The gate of first transistor T1 88 is connected to an output 67 of the first operational amplifier 82. The drain of the first transistor 88 and the supply input 65 of the first operational amplifier 62 receive Vhigh 210. The voltage that develops over R4 84 is proportional to I3 and to the ratio between R4 84 and R3 83.

The first end of R4 84 is also connected to the negative input 41 of second operational amplifier 42. The second operational amplifier 42 is included within the internal power supply module 40.

The positive input 43 of the second operational amplifier 42 is connected to a source of second transistor T2 86, to resistor R5 85 and to output 46 of the internal power supply module 40. The gate of second transistor T2 86 is connected to an output 47 of the second operational amplifier 42. The drain of the second transistor T2 86 and the supply input 45 of the second operational amplifier 42 receive Vhigh 210

The output signal Vsupply_analog 202 is responsive to Vref_stable 204, and noise_signal 206 as well as to the relation between R1 81, R2 82 and R3 83. It is noted that either one of resistors R1-R4 81-84 can be a variable resistor, thus allowing to change the characteristics of Vsupply_analog 202 during a test period and/or between test periods.

The inventors measured an immunity of a PLL by introducing a square wave noise that results in about 5% of the amplitude of the stable reference signal. Various PLLs were tested. Some PLL responded by having a phase jitter that well exceeded the specification and also had period jitter that well exceed the specifications.

Figure 4:
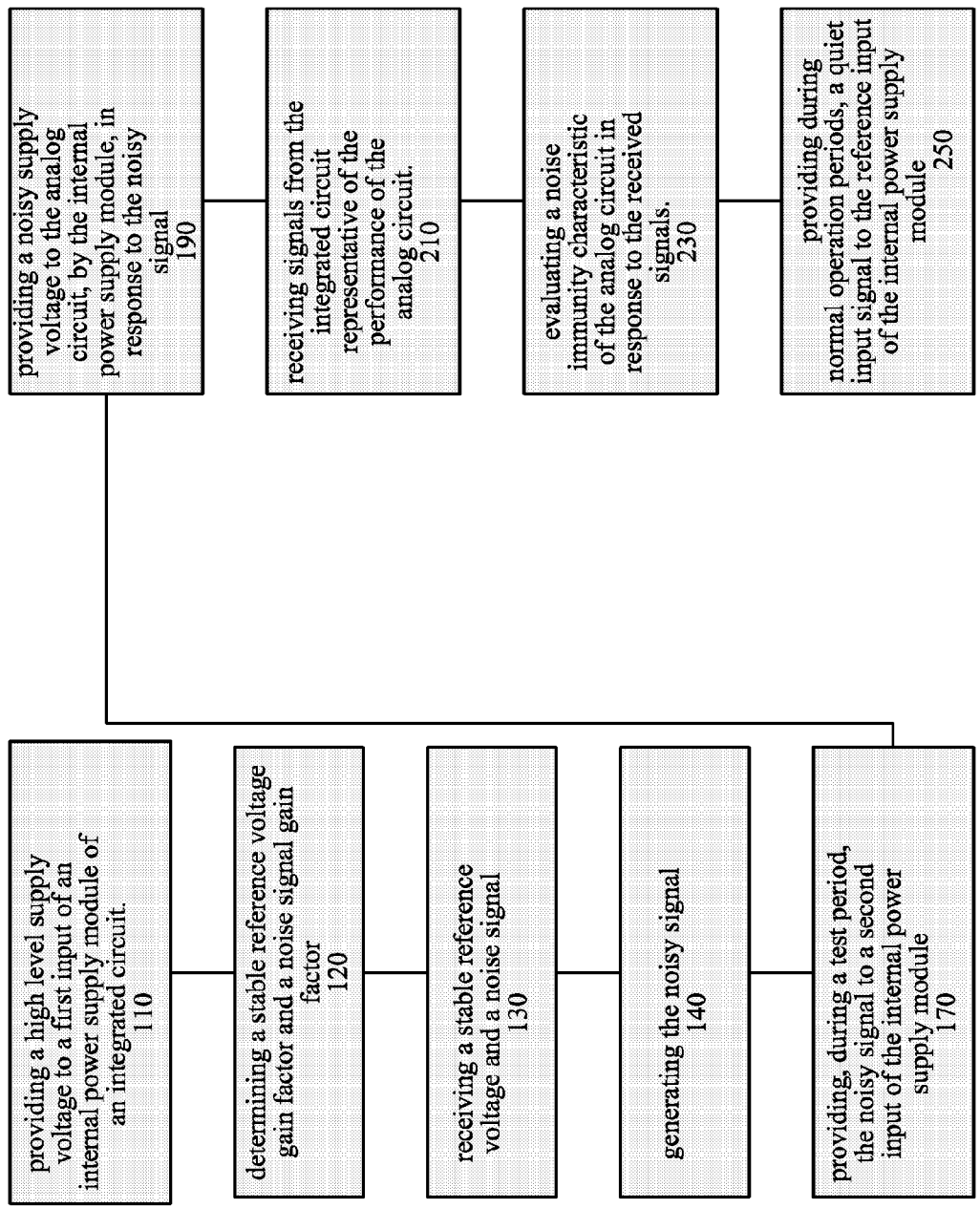
FIG. 4 is a flow chart of a method for evaluating one or more noise immunity characteristics of an analog circuit, according to an embodiment of the invention.

FIG. 4 is a flow chart of a method 100 for evaluating a noise immunity characteristic of an analog circuit, according to an embodiment of the invention.

Method 100 starts by stage 110 of providing a high level supply voltage to a first input of an internal power supply module of an integrated circuit. Referring to the example set forth in previous drawings, Vhigh 210 is provided to internal power supply module 40 and to signal modulator 60.

Stage 110 is followed by stage 120 of determining at least one characteristic of a noise signal in response to at least one characteristic of the analog circuit. This characteristic can be the frequency of the noise signal, its amplitude, its spectrum, and the like. It is noted that stage 120 can be executed prior to stage 110. It is further noted that the determination can define different characteristics that are applied during one or more test periods.

Conveniently, stage 120 includes determining a stable reference voltage gain factor and a noise signal gain factor. Referring to the example set forth in FIG. 3 these gain factors are responsive to various factors including the values of R1 81, R2 82 and R3 83. In order to adjust the gain factors these resistors can be adjustable resistors.

Stage 120 is followed by stage 130 of receiving a stable reference voltage and a noise signal. Referring to the example set forth in the previous drawings Vref_stable 204 and noise_signal 206 are provided to signal modulator 60.

Stage 130 is followed by stage 140 of generating a noisy signal. Referring to the example set forth in the previous drawings the signal generator 60 generates Vnoisy_reference 208, during a test period, in response to Vref_stable 204 and noise_signal 206.

Conveniently, stage 140 includes adding the stable reference voltage to the noise signal.

According to an embodiment of the invention stage 140 includes altering a frequency of the noise signal during a test period. According to another embodiment of the invention stage 140 includes altering a frequency of the noise signal between different test periods.

Conveniently, stage 140 includes amplifying the stable reference voltage by the stable reference voltage gain factor and amplifying the noise signal by the noise signal gain factor.

Stage 140 is followed by stage 170 of providing, during a test period, a noisy signal to a second input of the internal power supply module.

Referring to the example set forth in FIG. 1, Vnoisy_reference 208 is provided to input 42 of internal power supply module 40.

Conveniently, stage 170 may include providing the noise signal and the stable reference voltage to an operational amplifier. An exemplary illustration of such an option is illustrated in FIG. 3.

Stage 170 is followed by stage 190 of providing a noisy supply voltage to the analog circuit, by the internal power supply module, in response to the noisy signal.

Referring to the example set forth in the previous drawings internal power supply module 40 provides Vsupply_analog 202 to analog circuit 20. It is noted that during periods other than the test periods Vsupply_analog 202 is substantially quiet.

Stage 190 is followed by stage 210 of receiving one or more signals representative of the performance of the analog circuit. These can be signals outputted by the analog circuit, signals that are generated by the analog circuit and the like. They represent the performance of the analog circuit because they are affected by the analog circuit.

Stage 210 is followed by stage 230 of evaluating one or more noise immunity characteristic of the analog circuit in response to the received signals.

It is noted that the evaluation can be done during the test period, but this is not necessarily so. At least a part of the evaluation can be done after a testing period ends.

It is further noted that the evaluation can be responsive to signals received during multiple test periods. Stage 230 can include generating statistics, comparing measured signals to expected signals, and the like.

According to an embodiment of the invention a testing session includes multiple repetitions of stages 110-210. During different repetitions (different test periods) the environmental conditions (such as temperature), as well as the noise signal can vary. The evaluation can be responsive to signals that are received during one or more test periods.

Stage 230 is followed by stage 250 of providing, during normal operation periods, a quiet (not noisy) signal to the reference input of the internal power supply module.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for testing a noise immunity characteristic of an analog circuit of an integrated circuit comprising:
   providing a high level supply voltage to a first input of an internal power supply module of the integrated circuit,
   receiving output signals from the integrated circuit representative of a performance of the analog circuit;
   providing during a test period, a noisy signal to a second input of the internal power supply module;
   providing a noisy power supply to the analog circuit, by the internal power supply module, in response to the noisy signal; and
   evaluating the noise immunity characteristic of the analog circuit in response to the output signals.

2. The method according to claim 1 further comprising receiving a stable reference voltage and a noise signal and generating the noisy signal.

3. The method according to claim 2 wherein the generating comprises generating the noisy signal.

4. The method according to claim 2 wherein the generating comprises altering a spectrum of the noise signal during the test period.

5. The method according to claim 2 wherein the generating comprises altering a spectrum of the noise signal between different test periods.

6. The method according to claim 2 wherein the generating comprises providing the noise signal and the stable reference voltage to a summing element.

7. The method according to claim 2 further comprising determining a variable signal to noise ratio.

8. The method according to claim 1 wherein the generating comprises adding the noise signal to the stable reference voltage.

9. The method according to claim 1 further comprising providing, during normal operation periods, a quiet input signal to the reference input of the internal power supply module.

10. The method according to claim 1 further comprising determining at least one characteristic of the noise signal in response to at least one characteristic of the analog circuit.

11. A device comprising:
    an analog circuits;
    an internal stable reference signal source;
    an internal power supply module coupled to the analog circuit and adapted to receive, via first input, a high level voltage supply;
    a signal modulator that is adapted to provide, during a test period, a noisy signal to a second input of the internal power supply module;
    wherein the internal power supply module is adapted to output a noisy supply voltage to the analog circuit, in response to the noisy signal;
    wherein device is adapted to output an output signal representative of a noise immunity characteristic of the analog circuit.

12. The device according to claim 11 wherein the signal modulator generates the noisy signal in response to the stable reference voltage and to a noise signal.

13. The device according to claim 12 wherein the signal modulator is adapted to add the noise signal to the stable reference voltage.

14. The device according to claim 12 further comprising an internal noise generator adapted to generate, during the test period, the noise signal.

15. The device according to claim 12 wherein the noise generator is adapted to alter a spectrum of the noise signal during the test period.

16. The device according to claim 12 wherein the noise generator is adapted to alter a spectrum of the noise signal between different test periods.

17. The device according to claim 12 wherein the signal modulator comprises an amplifier.

18. The device according to claim 12 wherein the signal modulator is adapted to amplify the stable reference voltage by a stable reference voltage gain factor to amplify the noise signal by a noise signal gain factor.

19. The device according to claim 11 wherein the signal modulator is adapted to provide, during normal operation periods, a quiet signal to the internal power supply module.

20. The device according to claim 11 wherein the device comprises an internal testing circuit.

* * * * *